United States Patent
Abrol et al.

(10) Patent No.: US 9,147,018 B2
(45) Date of Patent: Sep. 29, 2015

(54) METHOD AND SYSTEM FOR USE IN CONTROLLING A PRESSURE VESSEL

(71) Applicant: General Electric Company, Schenectady, NY (US)

(72) Inventors: Sidharth Abrol, Greenville, SC (US); Maria Cecilia Mazzaro, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 371 days.

(21) Appl. No.: 13/738,579

(22) Filed: Jan. 10, 2013

(65) Prior Publication Data

US 2014/0195067 A1 Jul. 10, 2014

(51) Int. Cl.
| | |
|---|---|
| G05D 9/00 | (2006.01) |
| G05B 13/02 | (2006.01) |
| G06F 19/00 | (2011.01) |
| G01F 17/00 | (2006.01) |
| G01F 23/00 | (2006.01) |
| G01L 7/00 | (2006.01) |
| G01F 1/12 | (2006.01) |
| G01F 1/50 | (2006.01) |
| G01F 25/00 | (2006.01) |
| G01L 27/00 | (2006.01) |
| G06F 17/50 | (2006.01) |
| G05D 9/12 | (2006.01) |
| G05B 17/02 | (2006.01) |
| F24H 9/20 | (2006.01) |

(52) U.S. Cl.
CPC ............ *G06F 17/5018* (2013.01); *G05B 17/02* (2013.01); *G05D 9/12* (2013.01); *F24H 9/2021* (2013.01)

(58) Field of Classification Search
CPC ...... G05B 13/048; G06Q 10/04; C25D 21/12; F05D 2260/80; G01F 23/168; G01N 9/26; G21D 3/06
USPC ............. 700/28, 29, 44, 52, 53, 95, 108, 275, 700/276, 281; 701/99; 702/33, 50, 55, 85, 702/100, 182–184, 188; 703/2, 9, 10
See application file for complete search history.

(56) References Cited

U.S. PATENT DOCUMENTS

| | | | | |
|---|---|---|---|---|
| 3,914,795 | A | * 10/1975 | Alliston et al. | ............... 376/217 |
| 4,421,716 | A | * 12/1983 | Hench et al. | .................. 376/216 |
| 5,148,775 | A | 9/1992 | Peet | |
| 5,347,446 | A | * 9/1994 | Iino et al. | ........................ 700/29 |

(Continued)

FOREIGN PATENT DOCUMENTS

| | | |
|---|---|---|
| JP | 2006046874 A | 2/2006 |
| JP | 2007170814 A | 7/2007 |

*Primary Examiner* — Crystal J Barnes-Bullock
(74) *Attorney, Agent, or Firm* — Armstrong Teasdale LLP

(57) ABSTRACT

A control system for monitoring a pressure vessel includes a pressure sensor coupled to a first pressure vessel component. The system also includes a level sensor coupled to a second pressure vessel component. The system additionally includes at least one computing device including at least one input channel configured to receive data from the pressure sensor and the level sensor and a processor coupled to the at least one input channel. The processor is programmed to populate a level and pressure dynamics model associated with the pressure vessel with data received from the pressure sensor and the level sensor, the processor further programmed to be capable of controlling operation of the pressure vessel based on the level and pressure dynamics model.

17 Claims, 4 Drawing Sheets

(56) References Cited

U.S. PATENT DOCUMENTS

| | | |
|---|---|---|
| 5,771,846 A | 6/1998 | Ruchti |
| 6,446,027 B1 * | 9/2002 | O'Keeffe et al. ............. 702/183 |
| 7,017,407 B1 | 3/2006 | Hatfield et al. |
| 7,054,706 B2 * | 5/2006 | Kempf et al. ................ 700/121 |
| 7,457,735 B2 * | 11/2008 | Wu et al. ........................... 703/9 |
| 7,603,185 B2 | 10/2009 | Stewart et al. |
| 8,050,779 B2 * | 11/2011 | Nanno ............................ 700/29 |
| 8,370,088 B2 * | 2/2013 | Ammouri et al. ............... 702/55 |
| 8,370,089 B2 * | 2/2013 | Alstad et al. ..................... 702/55 |
| 8,676,436 B2 * | 3/2014 | Raimarckers et al. ....... 701/29.5 |
| 8,725,480 B2 * | 5/2014 | Blank et al. .................... 703/10 |
| 2005/0077182 A1 * | 4/2005 | Balisky et al. ................. 205/82 |
| 2005/0178759 A1 | 8/2005 | Arora et al. |
| 2009/0159018 A1 | 6/2009 | Mehendale et al. |
| 2009/0240603 A1 * | 9/2009 | Stephenson et al. ............ 705/28 |
| 2010/0126433 A1 | 5/2010 | Kozaki |
| 2011/0295432 A1 | 12/2011 | Kumar et al. |

* cited by examiner

METHOD AND SYSTEM FOR USE IN CONTROLLING A PRESSURE VESSEL

BACKGROUND OF THE INVENTION

The field of the invention relates generally to control systems for pressure vessels, and more particularly, to a method and system for calibrating a transient model for use in controlling a pressure vessel.

Pressure vessels are widely used in various power plants and related industries. The design principle uses the difference in density between cooler water in the downcomer and the steam/water mixture in the riser to drive the steam/water mixture through the tubes. The pressure vessel drum separates steam from water. Water enters the riser tube, is heated, and undergoes a transition from a single-phase liquid to a mixture of saturated liquid and steam. As heat input increases, the proportion of steam vapor in the riser tube increases.

A high-priority challenge to the control engineer is the ability to control the water level in the drum very precisely. When the water level gets too high, it can result in water carryover into the superheater or turbine, potentially causing damage or outages in the turbine or pressure vessel. A level that is too low can expose the water tubes to high heat input, causing them to crack or break. A pressure vessel trip interlock is supposed to prevent these types of damage, but pressure vessel trips can take considerable time to clear, during which the expensive production equipment is often forced to sit idle.

As a result, several methods of control systems have been designed to model the physics of the pressure vessel and therefore to give the control engineer the key determinants to understand the dynamics of the vessel. Based on such control systems, the control engineer can determine the water level and pressure of the system. A prevailing model is the Astrom-Bell 5-states drum model.

This model captures the key properties of pressure vessels over a wide operating range. The model also pays particular attention to modeling the pressure vessel drum water level dynamics. As stated above, this is a crucial consideration. The model consists of five state variables—the total water volume, the drum pressure, the steam quality at the riser exit, the steam volume below water level, and the downcomer exit flow rate.

Most known control systems adapting the Astrom-Bell 5-states model for pressure vessels use an initial pressure and level reading for the pressure vessel and then generate a calibrated model based upon the state variables above.

These systems are prone to inaccuracy because the parameters affecting level and pressure used are held as constants. In practice, if the physics captured by the model is inadequate or the physical system behavior changes from degradation because of tube fouling or scaling, these values may change and require a re-evaluation of the model to accurately predict level and pressure dynamics. In the absence of such re-evaluation, the system may become inadequately controlled.

Inadequate pressure vessel control can have significant practical consequences. It can result in increased maintenance costs, downtime, and potential damage to the pressure vessel.

BRIEF DESCRIPTION OF THE INVENTION

In one aspect, a control system for a pressure vessel is provided. The control system includes a pressure sensor coupled to a first pressure vessel component. The system also includes a level sensor coupled to a second pressure vessel component. The system additionally includes at least one computing device including at least one input channel configured to receive data from the pressure sensor and the level sensor and a processor coupled to the at least one input channel. The processor is programmed to populate a level and pressure dynamics model associated with the pressure vessel with data received from the pressure sensor and the level sensor, the processor further programmed to be capable of controlling operation of the pressure vessel based on the level and pressure dynamics model.

In a further aspect, a method of controlling a pressure vessel is provided. The method includes providing a computer-based model calibration system for the pressure vessel. The method also includes receiving pressure data from a pressure sensor coupled to a first pressure vessel component and receiving level data from a level sensor coupled to a second pressure vessel component. The method additionally includes populating a level and pressure dynamics model of the pressure vessel with at least a portion of the pressure data and the level data. The method further includes controlling the operation of the pressure vessel using the populated level and pressure dynamics model.

In another aspect, one or more non-transitory computer-readable storage media for controlling a pressure vessel, having computer-executable instructions embodied thereon is provided. When executed by at least one processor, the computer-executable instructions cause the at least one processor to populate a level and pressure dynamics model associated with the pressure vessel based on pressure data received from a pressure sensor coupled to the pressure vessel and level data from a level sensor coupled to the pressure vessel. When executed by the at least one processor, the computer-executable instructions further cause the at least one processor to control operation of the pressure vessel using the populated level and pressure dynamics model.

DETAILED DESCRIPTION OF THE INVENTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

As used herein, the terms "software" and "firmware" are interchangeable, and include any computer program stored in memory for execution by devices that include, without limitation, mobile devices, clusters, personal computers, workstations, clients, and servers.

As used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

As used herein, the term "non-transitory computer-readable media" and "non-transitory computer-readable storage media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and non-volatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Figure 1:
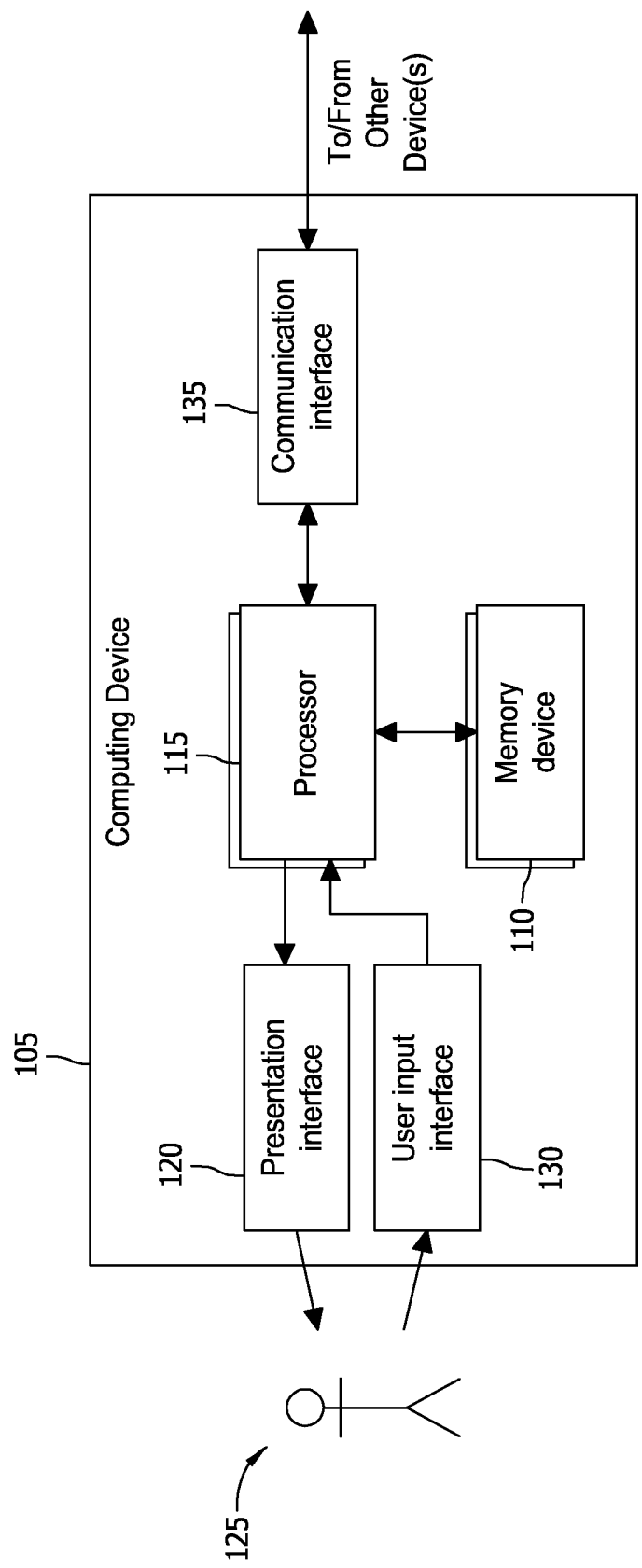
FIG. 1 is a block diagram of an exemplary computing device.

FIG. 1 is a block diagram of an exemplary computing device 105 that may be used to control a pressure vessel (not shown in FIG. 1). Computing device 105 includes a memory device 110 and a processor 115 operatively coupled to memory device 110 for executing instructions. Processor 115 may include one or more processing units. In some embodiments, executable instructions are stored in memory device 110. Computing device 105 is configurable to perform one or more operations described herein by programming processor 115. For example, processor 115 may be programmed by encoding an operation as one or more executable instructions and providing the executable instructions in memory device 110. In the exemplary embodiment, memory device 110 is one or more devices that enable storage and retrieval of information such as executable instructions and/or other data. Memory device 110 may include one or more computer readable media, such as, without limitation, random access memory (RAM), dynamic random access memory (DRAM), static random access memory (SRAM), a solid state disk, a hard disk, read-only memory (ROM), erasable programmable ROM (EPROM), electrically erasable programmable ROM (EEPROM), and/or non-volatile RAM (NVRAM) memory. The above memory types are exemplary only, and are thus not limiting as to the types of memory usable for storage of a computer program.

Further, as used herein, the terms "software" and "firmware" are interchangeable, and include any computer program stored in memory for execution by personal computers, workstations, clients and servers.

Memory device 110 may be configured to store sensor data including, without limitation, real-time and historical level and pressure data, and/or any other type data. In some embodiments, processor 115 removes or "purges" data from memory device 110 based on the age of the data. For example, processor 115 may overwrite previously recorded and stored data associated with a subsequent time and/or event. In addition, or alternatively, processor 115 may remove data that exceeds a predetermined time interval. Also, memory device 110 includes, without limitation, sufficient data, algorithms, and commands to facilitate controlling the pressure vessel.

As used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

In some embodiments, computing device 105 includes a presentation interface 120 coupled to processor 115. Presentation interface 120 presents information, such as a user interface and/or an alarm, to a user 125. In one embodiment, presentation interface 120 includes a display adapter (not shown) that is coupled to a display device (not shown), such as a cathode ray tube (CRT), a liquid crystal display (LCD), an organic LED (OLED) display, and/or an "electronic ink" display. In some embodiments, presentation interface 120 includes one or more display devices. In addition, or alternatively, presentation interface 120 includes an audio output device (not shown) (e.g., an audio adapter and/or a speaker) and/or a printer (not shown). In some embodiments, presentation interface 120 presents an alarm associated with the pressure vessel being monitored, such as by using a human machine interface (HMI) (not shown in FIG. 1).

In some embodiments, computing device 105 includes a user input interface 130. In the exemplary embodiment, user input interface 130 is coupled to processor 115 and receives input from user 125. User input interface 130 may include, for example, a keyboard, a pointing device, a mouse, a stylus, a touch sensitive panel (e.g., a touch pad or a touch screen), and/or an audio input interface (e.g., including a microphone). A single component, such as a touch screen, may function as both a display device of presentation interface 120 and user input interface 130.

A communication interface 135 is coupled to processor 115 and is configured to be coupled in communication with one or more other devices, such as a sensor or another computing device 105, and to perform input and output operations with respect to such devices while performing as an input channel. For example, communication interface 135 may include, without limitation, a wired network adapter, a wireless network adapter, a mobile telecommunications adapter, a serial communication adapter, and/or a parallel communication adapter. Communication interface 135 may receive data from and/or transmit data to one or more remote devices. For example, a communication interface 135 of one computing device 105 may transmit an alarm to the communication interface 135 of another computing device 105.

Presentation interface 120 and/or communication interface 135 are both capable of providing information suitable for use with the methods described herein (e.g., to user 125 or another device). Accordingly, presentation interface 120 and communication interface 135 may be referred to as output devices. Similarly, user input interface 130 and communication interface 135 are capable of receiving information suitable for use with the methods described herein and may be referred to as input devices.

Figure 2:
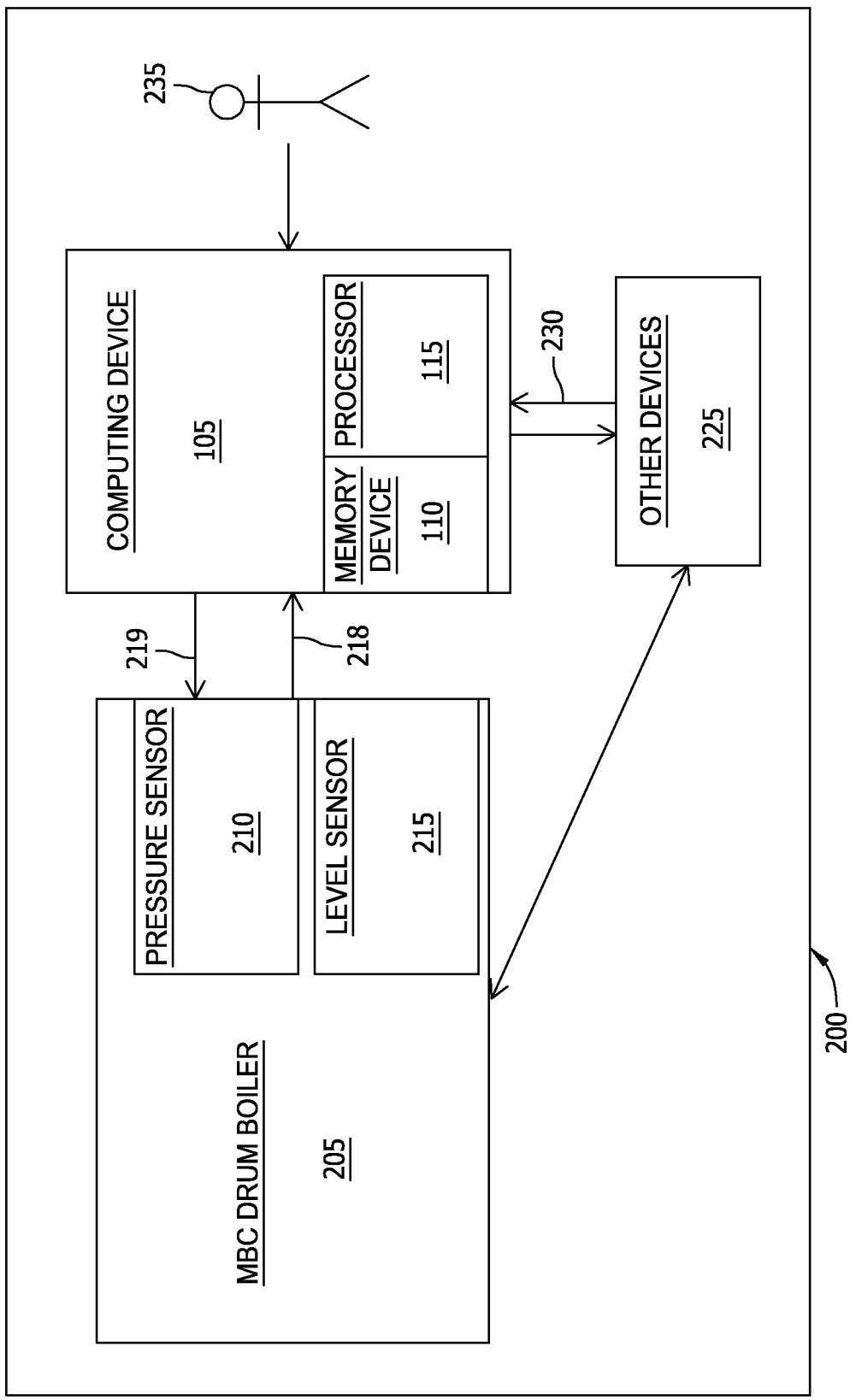
FIG. 2 is a block diagram of a portion of an exemplary control system for a pressure vessel that may be used with the computing device shown in FIG. 1.

FIG. 2 is a block diagram of a portion of an exemplary control system 200 for a pressure vessel 205 that may be used with computing device 105 (shown in FIG. 1). Control system 200 includes pressure vessel 205. In the exemplary embodiment, pressure vessel 205 is an MBC drum boiler. Alternatively, pressure vessel 205 may be, without limitation, a Heat Recovery Steam Generator (HRSG) boiler, a recovery boiler, an electric water boiler, or any pressure vessel 205 capable of interacting with control system 200. Pressure vessel 205 is coupled to pressure sensor 210 and level sensor 215. Pressure sensor 210 is capable of sensing steam line and pressure vessel 205 pressure readings (not shown) within associated pressure vessel. In the exemplary embodiment, pressure sensor 210 uses a piezoresistive strain gauge to detect pressure in pressure vessel 205. In alternative embodiments, pressure sensor 210 may include, without limitation, resonant sensors, thermal sensors, ionization sensors, capacitive sensors, electromagnetic sensors, piezoelectric sensors, optical sensors, and potentiometric sensors. Level sensor 215 is capable of sensing water levels (not shown) within associated pressure vessel 205. In the exemplary embodiment, level sensor 215 uses a conductivity probe (not shown) to sense water level. In alternative embodiments, level sensor 215 may include, without limitation, conductivity probes, capacitance probes, float control sensors, and differential pressure cells.

Pressure sensor 210 and level sensor 215 are configured to transmit information to at least one input channel 218. Input channel 218 is coupled to a computing device 105. In the exemplary embodiment, input channel 218 uses a network to communicate between pressure sensor 210, level sensor 215, and computing device 105. Embodiments of such a network may include operative coupling with, without limitation, the Internet, a local area network (LAN), a wide area network (WAN), a wireless LAN (WLAN), and/or a virtual private network (VPN). Input channel 218 may additionally communicate via wireless technology, including, without limitation, radio waves, microwaves, and cellular networks.

Computing device 105 includes a memory device 110 and a processor 115. Processor 115 and memory device 110 are coupled to one another. Moreover, in the exemplary embodiment, computing device 105 includes one processor 115 and one memory device 110. In alternative embodiments, computing device 105 may include a plurality of processors 115 and a plurality of memory devices 110. Computing device 105 is configured to receive information from input channel 218. In the exemplary embodiment, input channel 218 transmits information from level sensor 215 and pressure sensor 210. In alternative embodiments, input channel 218 may transmit additional information including, without limitation, historic data on pressure vessel pressure, historic data on water levels, state data, and parameter data.

Computing device 105 may be coupled to other devices 225 via a communication network 230. Embodiments of network 230 may include operative coupling with, without limitation, the Internet, a local area network (LAN), a wide area network (WAN), a wireless LAN (WLAN), and/or a virtual private network (VPN). While certain operations are described below with respect to particular computing devices 105, it is contemplated that any computing device 105 may perform one or more of the described operations. For example, computing device 105 may perform all of the operations below.

In the exemplary embodiment, computing device 105 is coupled to network 230 via communication interface 135. In an alternative embodiment, computing device 105 is integrated with other devices 225. As used herein, the term "computer" and related terms, e.g., "computing device", are not limited to integrated circuits referred to in the art as a computer, but broadly refers to a microcontroller, a microcomputer, a programmable logic controller (PLC), an application specific integrated circuit, and other programmable circuits (none shown in FIG. 2), and these terms are used interchangeably herein.

In operation, computing device 105 receives data from the pressure sensor 210 and level sensor 215 coupled to the pressure vessel 205 via at least one input channel 218. Computing device 105 receives and processes the received data and uses it to populate a level and pressure dynamics model (not shown) stored in memory device 110. Computing device 105 interacts with an operator 235 (e.g., via user input interface 130 and/or presentation interface 120) to display the level and pressure dynamics model. In one embodiment, computing device 105 presents information regarding pressure dynamics of the pressure vessel 205 including, for example, without limitation, the pressure, level, total water volume, drum pressure, steam quality at riser exit, steam volume below water level, downcomer exit flow rate, steam residence time, and heat input scale factor. In alternative embodiments, computing device 105 may present information including information associated with the logistics, efficiency, or economics of pressure vessel 205. Operator 235 interacts with the computing device 105 to control the operation of the pressure vessel 205 based upon the information presented. Computing device 105 includes, without limitation, sufficient data, algorithms, and commands to facilitate controlling the pressure vessel 205 by sending responses 219 to pressure vessel 205.

In an alternative embodiment, computing device 105 does not receive data from pressure sensor 210 and level sensor 215 and instead presents the operator 235 information regarding pressure dynamics based upon an offline simulation created using parameterized values for steam residence time and heat input scale factor (not shown).

Also, in alternative embodiments, additional sensors (not shown) similar to pressure sensor 210 and level sensor 215 may collect operational data measurements associated with the pressure dynamics of the pressure vessel (not shown). Such data is transmitted across network 230 and may be accessed by any device capable of accessing network 230 including, without limitation, desktop computers, laptop computers, and personal digital assistants (PDAs) (neither shown).

Figure 3:
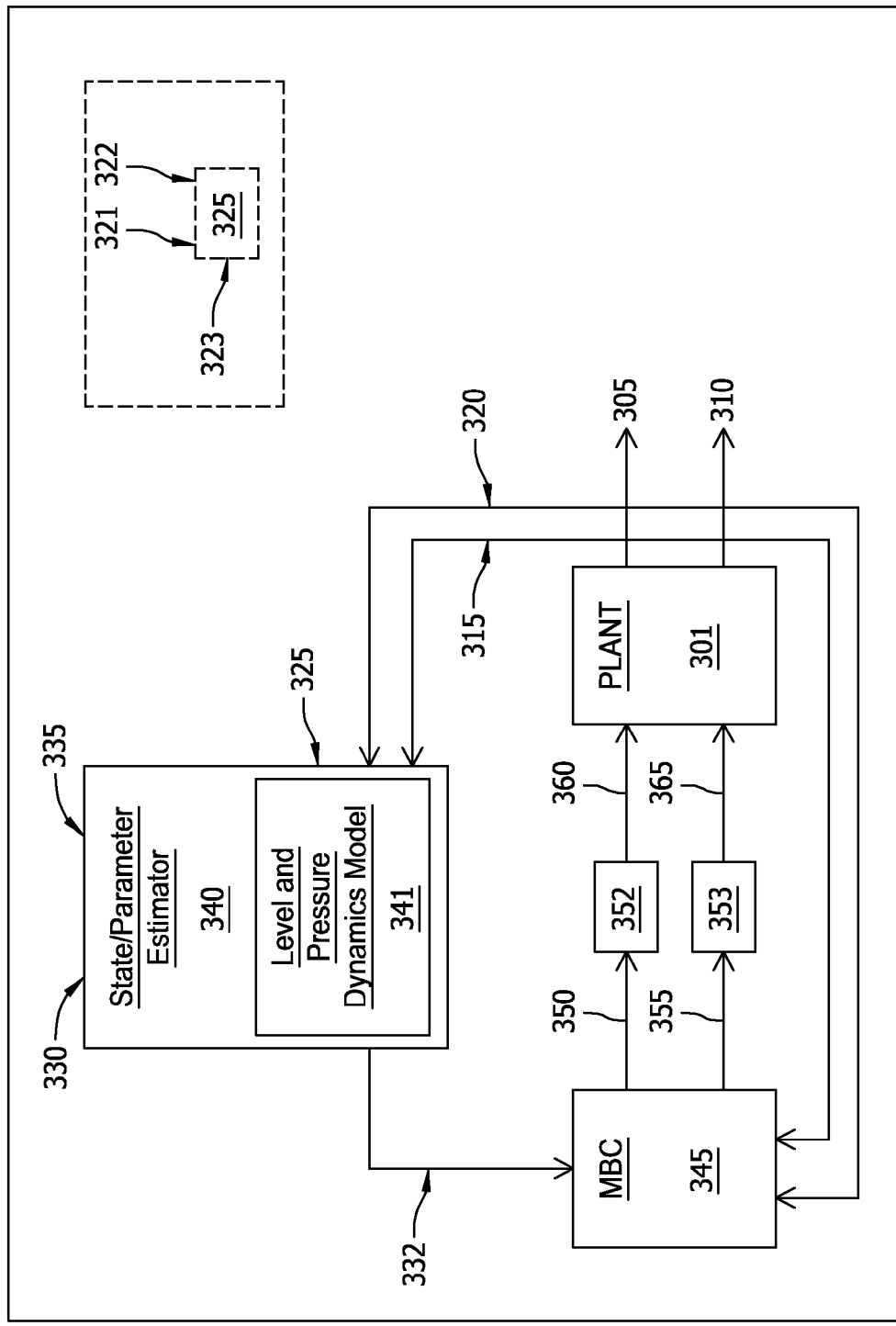
FIG. 3 is a flow chart of an exemplary process of using the control system of FIG. 2 to control the pressure vessel.

FIG. 3 is a flow chart of an exemplary process 300 of using the control system 200 to control the pressure vessel 205 (both shown in FIG. 2). Pressure vessel 345 releases a combination of water and steam that have a feedwater flow 350 and a steam flow 355. Total feedwater flow 352 flows through a feedwater valve 360 into an operational plant 301. Total steamflow 353 passes through a bypass valve 365 into operational plant 301.

At operational plant 301, detection of pressure vessel pressure 305 and pressure vessel water level 310 is performed. Pressure vessel pressure 305 is detected using pressure sensor 210 (shown in FIG. 2) and transmitted as pressure data 315 to state/parameter estimator 340. Pressure vessel water level 310 is detected using level sensor 210 (shown in FIG. 2) and transmitted as level data 320 to state parameter/estimator 340.

In the exemplary embodiment, state/parameter estimator 340 is computer software located in computing device 105. State/parameter estimator 340 is stored in memory device 110 and executed by processor 115. State/parameter estimator 340 receives pressure data 315 and level data 320 and populates level and pressure dynamics model 341. In the exemplary embodiment, level and pressure dynamics model 341 is a multi-state drum model, and more specifically an Astrom-Bell 5-states model, wherein the 5 states represented are total water volume, drum pressure, steam quality at the riser exit, steam volume below water level, and downcomer exit flow rate (none shown). Level and pressure dynamics model 341 further utilizes values for level and pressure as inputs to produce the values listed above. In alternative embodiments, level and pressure dynamics model 341 may be any model 341 that allows for the modeling of the level and pressure dynamics (not shown) within a pressure vessel 205 utilizing pressure data 315 and/or level data 320 as inputs. The model 341 may include, without limitation, any complex physical models for modeling level and pressure dynamics.

In the exemplary embodiment, a method of linear quadratic estimation is applied to pressure data 315 and level data 320 before populating level and pressure dynamics model 341. An example of such linear quadratic estimation is the extended Kalman filter. Linear quadratic estimation linearizes pressure data 315 and level data 320 and reduces or removes noise from data. In alternative embodiments, other estimation methods may be used, including, without limitation, moving horizon estimation, Kalman filters, fast Kalman filters, and invariant extended Kalman filters.

In the exemplary embodiment, populating level and pressure dynamics model 341 includes calibrating (not shown) level and pressure dynamics model 341 to accurately predict level and pressure dynamics across a wide operating region for the pressure vessel 205, the wide operating region representing plant startup, load swings, and shutdown. Calibrating level and pressure dynamics model 341 further includes calibrating to accurately predict level shrink and swell effects in the wide operating range.

Based upon populated level and pressure dynamics model 341, user 235 may send commands 332 to control the function of boiler 345. In alternative embodiments, state/parameter estimator 340 may be associated at computing device 105 with programmatic methods that send commands 332 to control function of boiler 345.

In an alternative embodiment, state/parameter estimator 340 fits a response surface to obtain values for total water volume, drum pressure, steam quality at the riser exit, steam volume below water level, and downcomer exit flow rate. Dynamic values for feedwater flow 330, steam flow 335, gas flow 321, gas temperature 322, and feedwater enthalpy 323 are obtained to determine parameterized values for steam residence time and heat input scale factor (neither shown) which may be used to populate level and pressure dynamics model 341. In this embodiment, a mathematical modeling program is used. The mathematical program may include, without limitation, any proprietary, open-source, or commercial program available for modeling. In this embodiment, mathematical modeling uses a best-fit, lowest root-mean-square-deviation approach. In alternative embodiments, mathematical modeling may use any mathematical fit approach to obtain values. These fit methods may include, without limitation, root-mean-square fits, squared deviations, normalized root-mean-square deviations, mean absolute error, and mean squared error.

Figure 4:
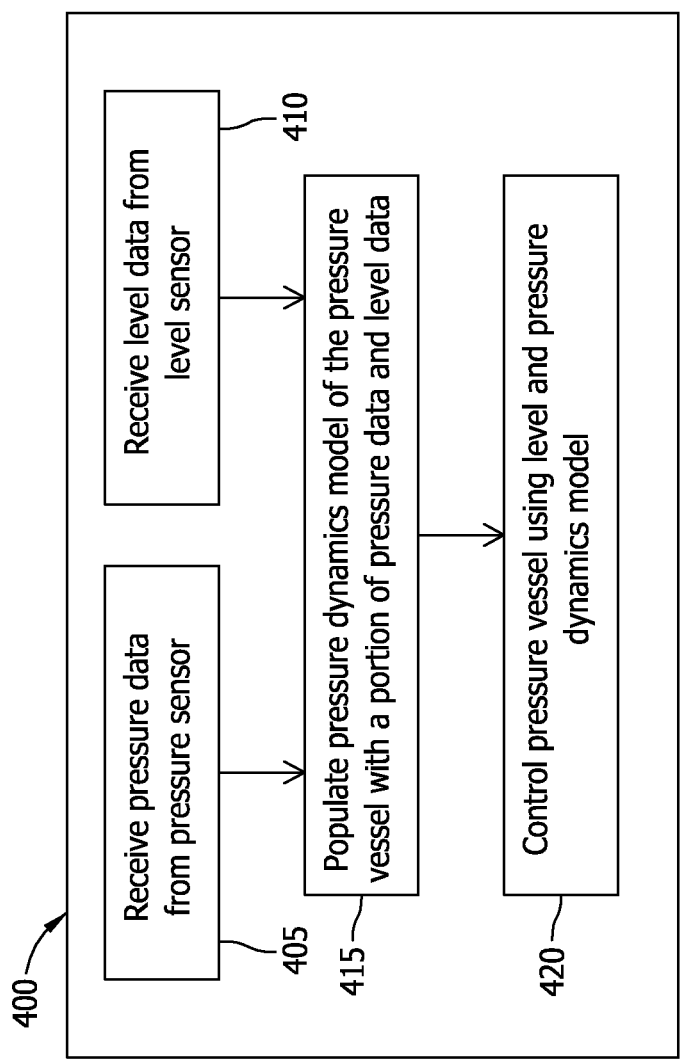
FIG. 4 is a flow chart of an exemplary method of controlling a pressure vessel using the system shown in FIG. 2.

FIG. 4 is a flow chart of an exemplary method 400 of controlling a pressure vessel 205 using the system 200 (both shown in FIG. 2). More specifically, method 400 defines a method of using received pressure and level data to determine the pressure dynamics of a pressure vessel 205 (shown in FIG. 2) and control the pressure vessel 205 using a populated level and pressure dynamics model.

Method 400 includes receiving 405 pressure data 315 (shown in FIG. 3) from pressure sensor 210 (shown in FIG. 2). Method 400 further includes receiving 410 level data 320 (shown in FIG. 3) from level sensor 215 (shown in FIG. 2). In the exemplary embodiment, receiving 405 pressure data 315 and receiving 410 level data 320 represents receiving data sent from pressure sensor 210 (shown in FIG. 2) and level sensor 215 (shown in FIG. 2) via input channel 218 (shown in FIG. 2) at computing device 105 (shown in FIG. 2).

Method 400 further includes populating 415 level and pressure dynamics model 341 (shown in FIG. 3) associated with pressure vessel 205. In the exemplary embodiment, populating 415 level and pressure dynamics model 341 represents applying the received pressure data 315 and level data 320 to level and pressure dynamics model 341 that uses pressure data 315 and level data 320 as necessary and sufficient inputs to demonstrate level and pressure dynamics in pressure vessel 205.

As described in process 300, in the exemplary embodiment, populating 415 level and pressure dynamics model 341 includes calibrating level and pressure dynamics model 341 to accurately predict level and pressure dynamics across a wide operating region for the pressure vessel 205, the wide operating region representing plant startup, load swings, and shutdown. Calibrating level and pressure dynamics model 341 further includes calibrating to accurately predict level shrink and swell effects in the wide operating range.

Method 400 also uses populated level and pressure dynamics model 341 to control 420 pressure vessel 205. Control 420 of pressure vessel 205 may include any actions taken associated with the regulation of the pressure vessel including, without limitation, reducing drum pressure, increasing steam quality at riser exit, reducing water level, and reducing gas temperature. Control 420 of pressure vessel 205 may further include sending a technician for physical inspection or maintenance of pressure vessel 205.

In some embodiments a method of linear quadratic estimation (e.g., an extended Kalman filter) is used on pressure data received 315 and level data received 320 to improve the data quality. Also, in some embodiments, populating 415 level and pressure dynamics model 341 uses level and pressure dynamics model 341 known as an Astrom-Bell 5-states model.

In alternative embodiments, level and pressure dynamics model can be simulated in the absence of received pressure data 315 or level data 320 by utilizing an offline simulation.

In contrast to known control systems for pressures vessels, the control system for a pressure vessel described herein utilize the received pressure data and level data to correct the level and pressure dynamics model as the model becomes inconsistent. Such an improved model increases improved pressure vessel efficiency and plant efficiency, decreased time and cost for repair and maintenance, and decreased risk of damage to the pressure vessel.

An exemplary technical effect of the methods, systems, and apparatus described herein includes at least one of (a) reducing cost of boiler operation and management by determining accurate state data for total water volume (b) increasing efficiency of boiler operation by determining accurate state data for drum pressure; (c) enhancing level and pressure dynamics modeling of pressure vessel to reduce damage and disrepair of pressure vessel; and (d) providing offline simulation for pressure vessel level and pressure dynamics during signal outage.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other assemblies and methods.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

While the invention has been described in terms of various specific embodiments, those skilled in the art will recognize that the invention can be practiced with modification within the spirit and scope of the claims.

What is claimed is:

1. A control system for a pressure vessel, said control system comprising:
    a pressure sensor coupled to a first pressure vessel component;
    a level sensor coupled to a second pressure vessel component; and
    at least one computing device comprising:
        at least one input channel configured to receive data from said pressure sensor and said level sensor; and
        a processor coupled to said at least one input channel, said processor programmed to populate a level and pressure dynamics model associated with the pressure vessel with data received from said pressure sensor and said level sensor, said processor further programmed to be capable of controlling operation of the pressure vessel based on said level and pressure dynamics model, wherein said level and pressure dynamics model comprises a multi-state drum model comprising a model for determining state data including total water volume, drum pressure, steam quality at the riser exit, steam volume below water level, and downcomer exit flow rate based upon level and pressure input.

2. A control system in accordance with claim 1, wherein said processor uses linear quadratic estimation with data received from said pressure sensor and said level sensor to online calibrate and populate said level and pressure dynamics model.

3. A control system in accordance with claim 1, wherein said processor further comprises an offline simulation of said level and pressure dynamics model.

4. A control system in accordance with claim 3, wherein said offline simulation further comprises an interpolation using a fitted response surface for at least one of the parameterized values for steam residence time and heat input scale factor based upon dynamic values of feedwater flow, feedwater enthalpy, steam flow, gas flow and gas temperature.

5. A control system in accordance with claim 1, wherein said processor is programmed to populate a level and pressure dynamics model associated with the pressure vessel with data received from said pressure sensor and said level sensor is further programmed to:
    calibrate said level and pressure dynamics model to accurately predict level and pressure dynamics across a wide operating region for the pressure vessel, the wide operating region representing plant startup, load swings, and shutdown; and
    calibrate said level and pressure dynamics model to accurately predict level shrink and swell effects in the wide operating range.

6. A control system in accordance with claim 1, wherein the pressure vessel is a boiler steam drum used in a heat recovery steam generator (HRSG).

7. A method of controlling a pressure vessel, said method comprising:
    providing a computer-based control system for the pressure vessel;
    receiving pressure data from a pressure sensor coupled to a first pressure vessel component;
    receiving level data from a level sensor coupled to a second pressure vessel component;
    populating a level and pressure dynamics model of the pressure vessel with at least a portion of said pressure data and said level data, by populating a multi-state drum model that includes a model for use in determining state data including total water volume, drum pressure, steam quality at the riser exit, steam volume below water level, and downcomer exit flow rate based upon level and pressure input; and
    controlling the operation of the pressure vessel using said populated level and pressure dynamics model.

8. A method in accordance with claim 7, wherein populating said level and pressure dynamics model comprises using linear quadratic estimation on pressure data and level data.

9. A method in accordance with claim 7, further comprising generating an offline simulation of said level and pressure dynamics model.

10. A method in accordance with claim 9, wherein generating an offline simulation further comprises generating an interpolation using a fitted response surface for at least one of the parameterized values for steam residence time and heat input scale factor based upon dynamic values of feedwater flow, feedwater enthalpy, steam flow, gas flow and gas temperature.

11. A method in accordance with claim 7, wherein populating a level and pressure dynamics model of the pressure vessel with at least a portion of said pressure data and said level data further comprises:
    calibrating said level and pressure dynamics model to accurately predict level and pressure dynamics across a wide operating region for the pressure vessel, the wide operating region representing plant startup, load swings, and shutdown; and
    calibrating said level and pressure dynamics model to accurately predict level shrink and swell effects in the wide operating range.

12. A method in accordance with claim 7, wherein the pressure vessel is a boiler steam drum used in a heat recovery steam generator (HRSG).

13. One or more non-transitory computer-readable storage media for controlling a pressure vessel, having computer-executable instructions embodied thereon, wherein when executed by at least one processor, the computer-executable instructions cause the at least one processor to:
    populate a level and pressure dynamics model associated with the pressure vessel based on pressure data received from a pressure sensor coupled to the pressure vessel and level data from a level sensor coupled to the pressure vessel, wherein said level and pressure dynamics model comprises a multi-state drum model comprising a model that determines state data including total water volume, drum pressure, steam quality at the riser exit, steam volume below water level, and downcomer exit flow rate based upon level and pressure input; and
    control operation of the pressure vessel using said populated level and pressure dynamics model.

14. One or more non-transitory computer-readable storage media in accordance with claim 13, wherein when executed by at least one processor, the computer-executable instructions further cause the at least one processor to use linear quadratic estimation to populate said level vand pressure dynamics model.

15. One or more non-transitory computer-readable storage media in accordance with claim 13, wherein when executed by at least one processor, the computer-executable instructions further cause the at least one processor to populate said level and pressure dynamics model wherein said level and pressure dynamics model comprises an offline simulation of said level and pressure dynamics model.

16. One or more non-transitory computer-readable storage media in accordance with claim 15, wherein said offline simulation further comprises an using a fitted response surface for at least one of the parameterized values for steam residence time and heat input scale factor based upon dynamic values of feedwater flow, feedwater enthalpy, steam flow, gas flow and gas temperature.

17. One or more non-transitory computer-readable storage media in accordance with claim 13, wherein when executed by at least one processor, the computer-executable instructions cause the at least one processor to:
   calibrate said level and pressure dynamics model to accurately predict level and pressure dynamics across a wide operating region for the pressure vessel, the wide operating region representing plant startup, load swings, and shutdown; and
   calibrate said level and pressure dynamics model to accurately predict level shrink and swell effects in the wide operating range.

* * * * *